(12) United States Patent
Liu et al.

(10) Patent No.: US 10,991,759 B2
(45) Date of Patent: Apr. 27, 2021

(54) METHODS OF FORMING VERTICAL FIELD-EFFECT TRANSISTOR WITH SELFALIGNED CONTACTS FOR MEMORY DEVICES WITH PLANAR PERIPHERY/ARRAY AND INTERMEDIATE STRUCTURES FORMED THEREBY

(71) Applicant: Micron Technology, Inc., Boise, ID (US)

(72) Inventors: Jun Liu, Boise, ID (US); Sanh D. Tang, Boise, ID (US); David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 221 days.

(21) Appl. No.: 15/497,032

(22) Filed: Apr. 25, 2017

(65) Prior Publication Data
US 2017/0243921 A1 Aug. 24, 2017

Related U.S. Application Data

(62) Division of application No. 13/078,274, filed on Apr. 1, 2011, now Pat. No. 9,673,102.

(51) Int. Cl.
| | |
|---|---|
| H01L 27/24 | (2006.01) |
| H01L 27/105 | (2006.01) |
| H01L 29/66 | (2006.01) |
| H01L 29/78 | (2006.01) |
| H01L 45/00 | (2006.01) |

(Continued)

(52) U.S. Cl.
CPC .. *H01L 27/2454* (2013.01); *H01L 21/823487* (2013.01); *H01L 27/105* (2013.01); *H01L 27/2463* (2013.01); *H01L 29/45* (2013.01); *H01L 29/665* (2013.01); *H01L 29/66666* (2013.01); *H01L 29/7827* (2013.01); *H01L 45/06* (2013.01); *H01L 45/1233* (2013.01); *H01L 45/144* (2013.01); *H01L 45/1683* (2013.01)

(58) Field of Classification Search
USPC .................................................. 257/E21.507
See application file for complete search history.

(56) References Cited

U.S. PATENT DOCUMENTS

| | | |
|---|---|---|
| 5,777,358 A | 7/1998 | Yajima |
| 6,903,419 B2 | 6/2005 | Ohsawa |
| 6,951,789 B2 | 10/2005 | Voshell et al. |

(Continued)

*Primary Examiner* — Erik T. K. Peterson
(74) *Attorney, Agent, or Firm* — Holland & Hart LLP

(57) ABSTRACT

Methods of forming a memory device having an array portion including a plurality of array transistors and a periphery region including peripheral circuit transistor structures of the memory device, where an upper surface of the periphery region and an upper surface of the array portion are planar (or nearly planar) after formation of the peripheral circuit transistor structures and a plurality of memory cells (formed over the array transistors). The method includes forming the peripheral circuit transistor structures in the periphery region, forming the plurality of array transistors in the array portion and forming a plurality of memory cells over respective vertical transistors. Structures formed by the method have planar upper surfaces of the periphery and array regions.

17 Claims, 25 Drawing Sheets

(51) Int. Cl.
*H01L 21/8234* (2006.01)
*H01L 29/45* (2006.01)

(56) References Cited

U.S. PATENT DOCUMENTS

| | | | |
|---|---|---|---|
| 7,205,598 | B2 | 4/2007 | Voshell et al. |
| 7,341,892 | B2 | 3/2008 | Matsuoka et al. |
| 7,364,997 | B2 | 4/2008 | Juengling |
| 7,427,531 | B2 | 9/2008 | Cho et al. |
| 7,586,149 | B2 | 9/2009 | Yoon et al. |
| 7,642,125 | B2 | 1/2010 | Lung et al. |
| 7,700,441 | B2 | 4/2010 | Kim et al. |
| 7,736,980 | B2 | 6/2010 | Juengling |
| 7,781,285 | B2 | 8/2010 | Kim et al. |
| 7,795,109 | B2 | 9/2010 | Weis et al. |
| 7,847,329 | B2 | 12/2010 | Pellizzer et al. |
| 7,847,374 | B1* | 12/2010 | Wang ............ H01L 27/24 257/560 |
| 7,932,167 | B2* | 4/2011 | Furukawa ......... H01L 27/2454 438/597 |
| 7,943,978 | B2 | 5/2011 | Kim et al. |
| 7,968,876 | B2 | 6/2011 | Lung et al. |
| 7,977,736 | B2 | 7/2011 | Kim et al. |
| 8,198,160 | B2 | 6/2012 | Liu |
| 8,310,864 | B2 | 11/2012 | Lung et al. |
| 8,324,673 | B2 | 12/2012 | Chung et al. |
| 8,350,316 | B2 | 1/2013 | Lung et al. |
| 8,395,935 | B2 | 3/2013 | Lung et al. |
| 8,598,010 | B2 | 12/2013 | Joo et al. |
| 8,772,848 | B2 | 7/2014 | Zahurak et al. |
| 8,786,009 | B2 | 7/2014 | Kim et al. |
| 9,024,289 | B2 | 5/2015 | Rho et al. |
| 2002/0003275 | A1 | 1/2002 | Lee et al. |
| 2004/0262635 | A1* | 12/2004 | Lee ................ H01L 29/792 257/199 |
| 2005/0263823 | A1* | 12/2005 | Hwang ............ H01L 29/7843 257/368 |
| 2005/0263829 | A1* | 12/2005 | Song ................ H01L 29/7843 257/379 |
| 2007/0080385 | A1* | 4/2007 | Kim ................ H01L 27/10876 257/296 |
| 2008/0049486 | A1* | 2/2008 | Gruening-von Schwerin ............ G11C 13/0028 365/104 |
| 2008/0283816 | A1* | 11/2008 | Takaishi ............ H01L 27/24 257/4 |
| 2009/0001337 | A1* | 1/2009 | Furukawa ............ H01L 45/06 257/2 |
| 2009/0034319 | A1* | 2/2009 | Ha .................. H01L 27/2409 365/148 |
| 2009/0286368 | A1* | 11/2009 | Lam ................ H01L 21/8249 438/234 |
| 2010/0038743 | A1* | 2/2010 | Lee ................ H01L 27/0688 257/499 |
| 2010/0295009 | A1* | 11/2010 | Lung ................ H01L 27/101 257/2 |
| 2010/0295123 | A1* | 11/2010 | Lung ................ H01L 27/101 257/334 |
| 2010/0315867 | A1* | 12/2010 | Aizawa ............ H01L 45/1616 365/163 |
| 2011/0001114 | A1* | 1/2011 | Zanderighi ............ H01L 45/06 257/4 |
| 2011/0256119 | A1* | 10/2011 | Kim ................ A61K 38/53 424/94.5 |
| 2011/0305074 | A1* | 12/2011 | Lung ................ H01L 27/2445 365/163 |
| 2012/0087181 | A1* | 4/2012 | Lung ................ H01L 27/10 365/163 |
| 2014/0299831 | A1 | 10/2014 | Park |

* cited by examiner

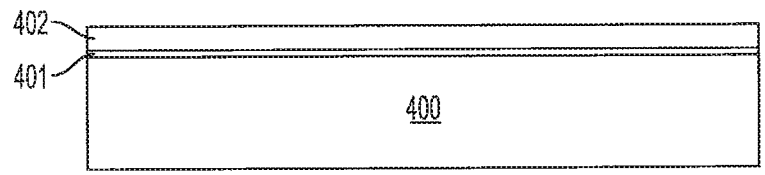
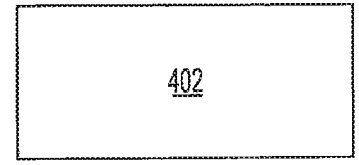
FIG. 4Ai                FIG. 4Aii
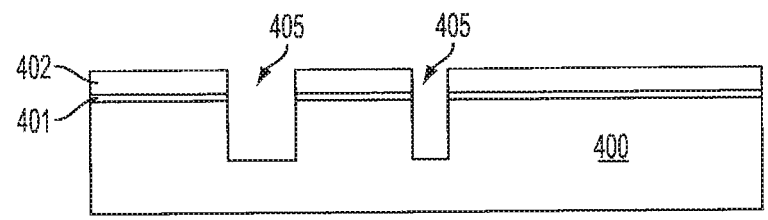
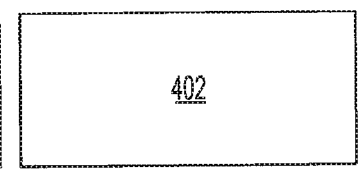
FIG. 4Bi                FIG. 4Bii
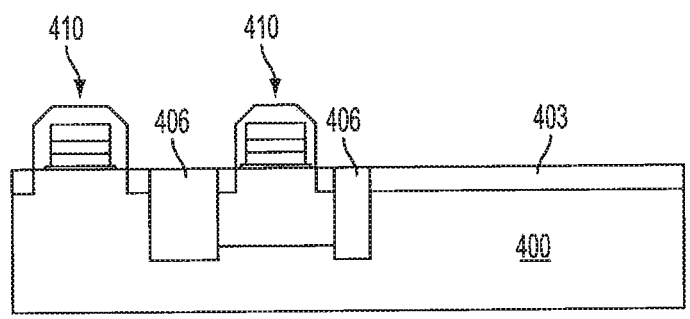
FIG. 4Ci                FIG. 4Cii

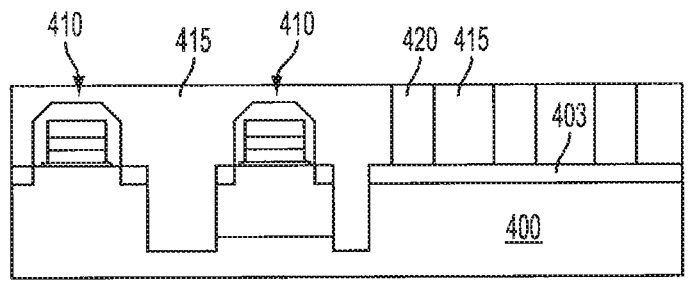
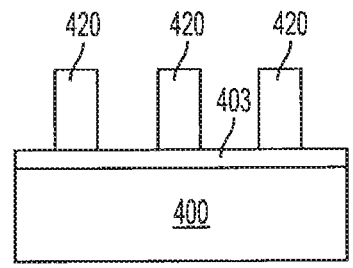
FIG. 4Gi    FIG. 4Gii
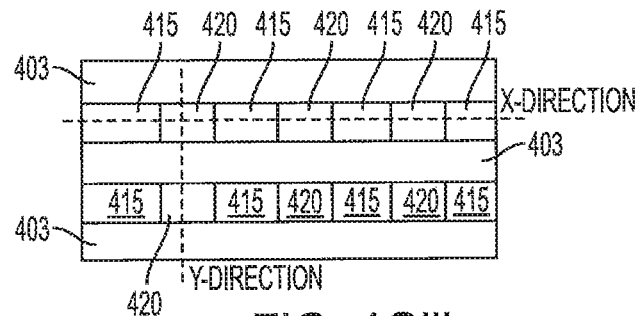
FIG. 4Giii
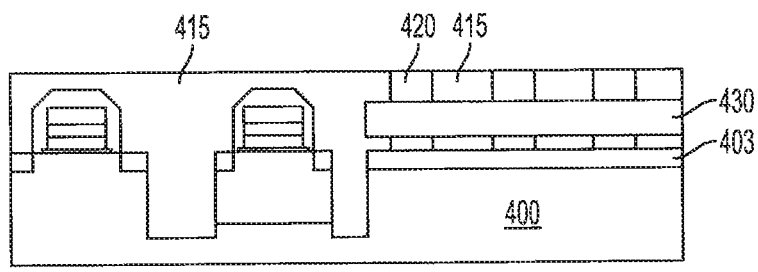
FIG. 4Hi
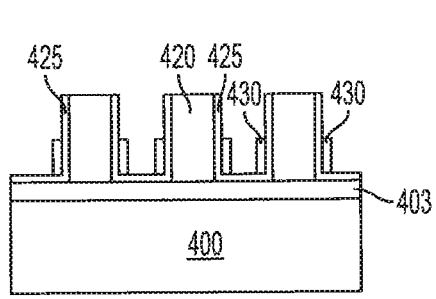
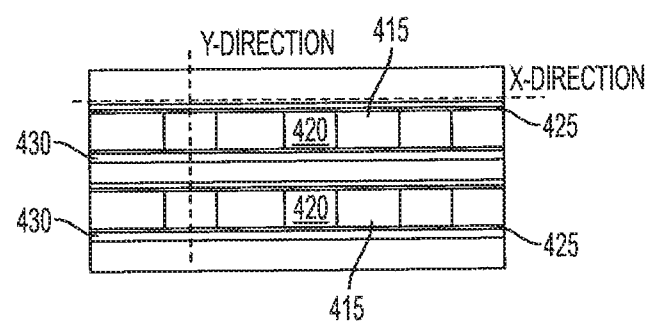
FIG. 4Hii    FIG. 4Hiii

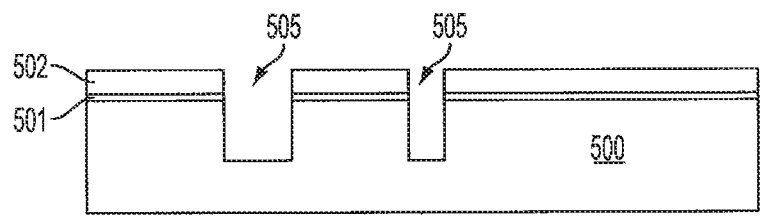 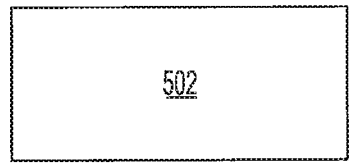
FIG. 5Ai  FIG. 5Aii
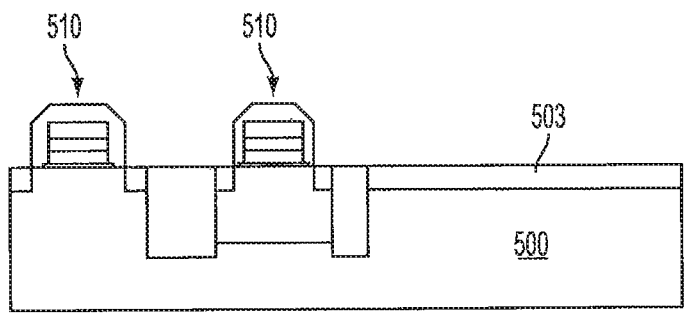 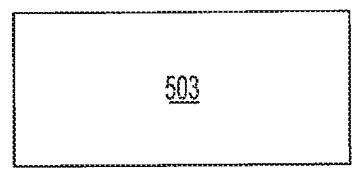
FIG. 5Bi  FIG. 5Bii
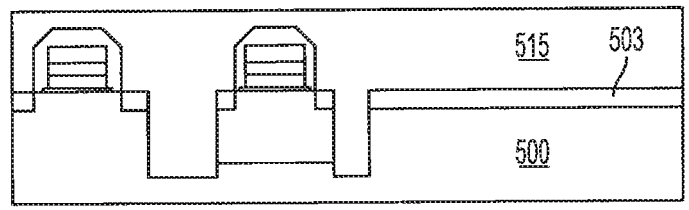 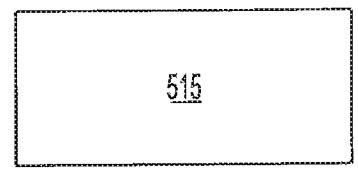
FIG. 5Ci  FIG. 5Cii

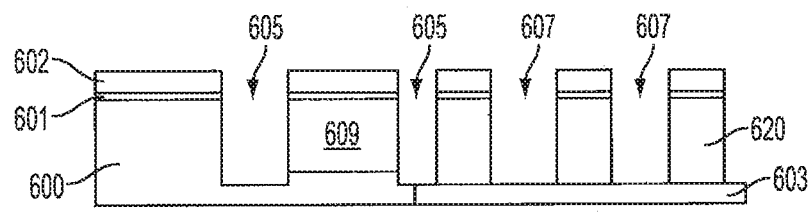
FIG. 6A
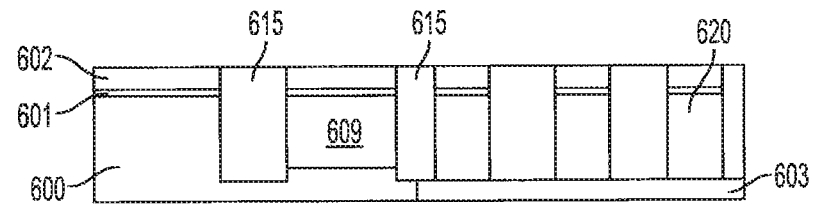
FIG. 6Bi
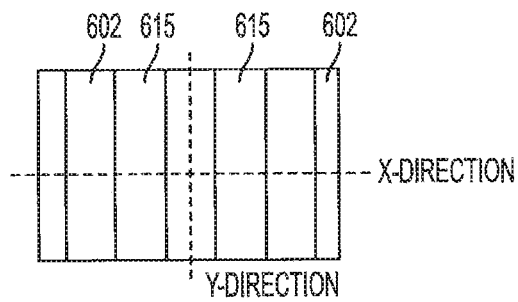
FIG. 6Bii
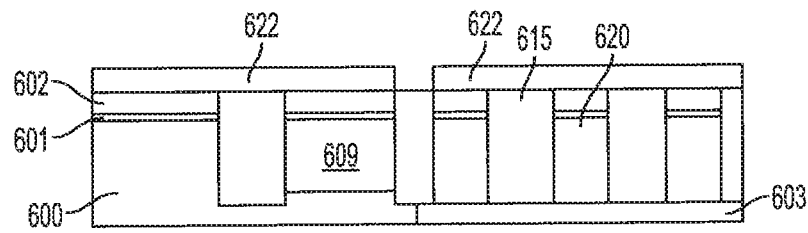
FIG. 6Ci
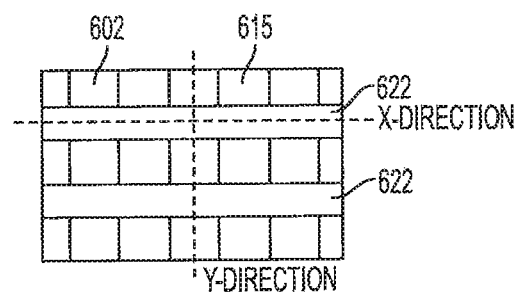
FIG. 6Cii

FIG. 6Giii

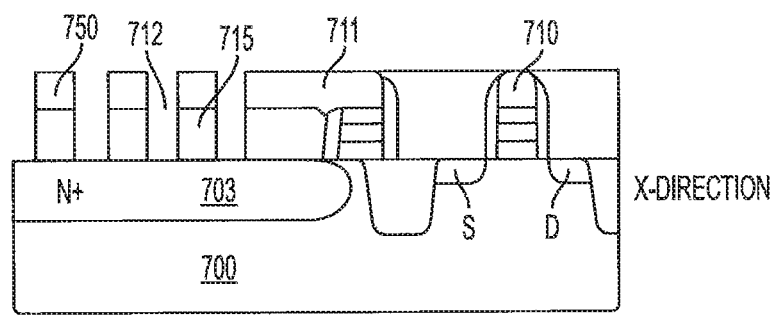
FIG. 7Gi
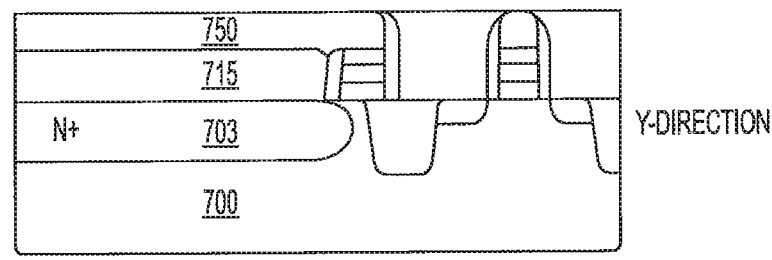
FIG. 7Gii

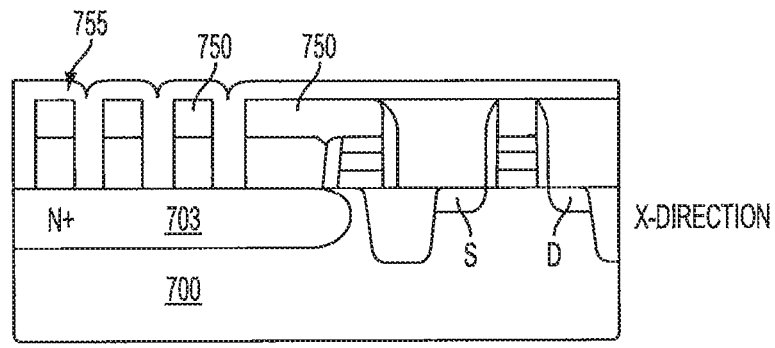
FIG. 7Hi
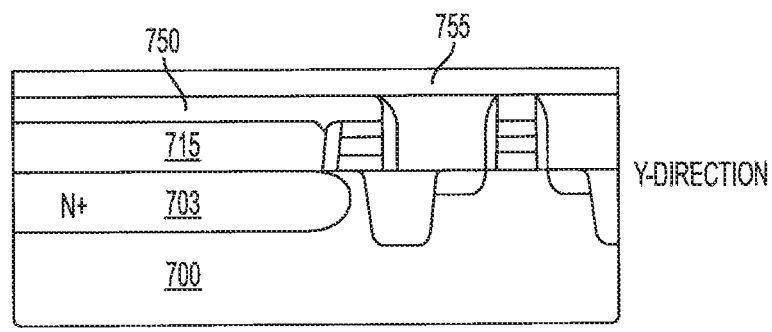
FIG. 7Hii

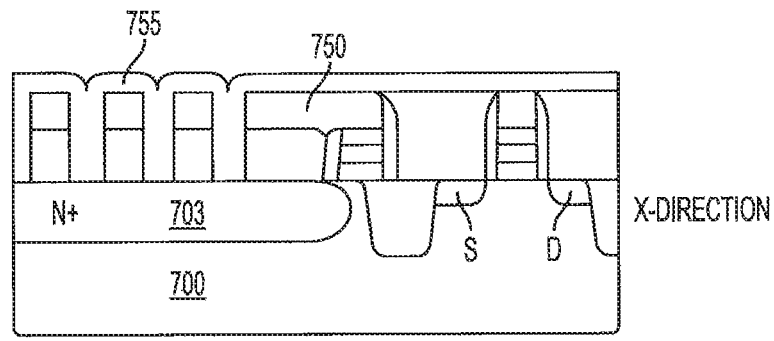
FIG. 7Iii
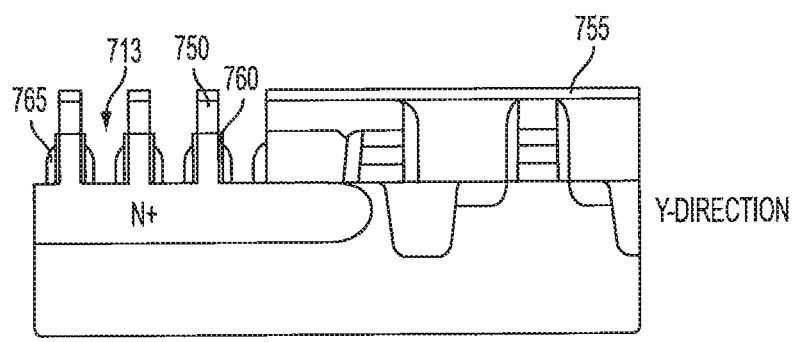
FIG. 7Iii

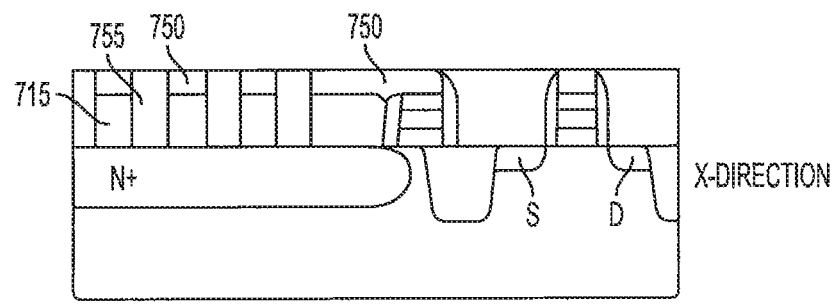
FIG. 7Ji
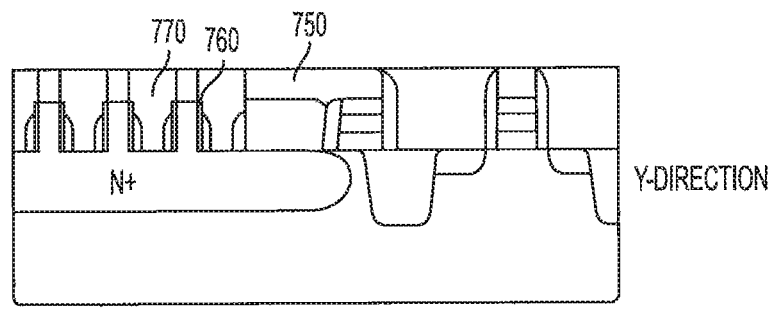
FIG. 7Jii

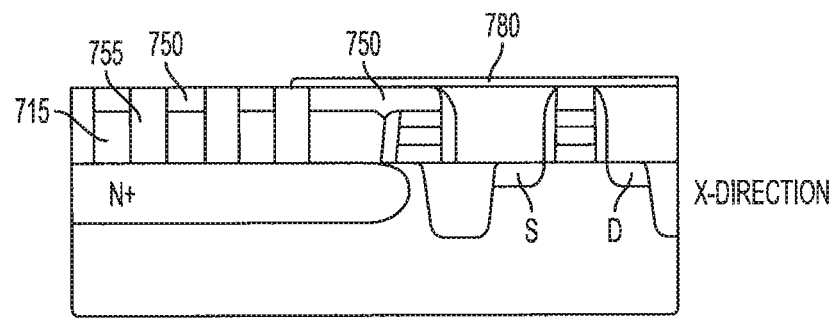
FIG. 7Ki
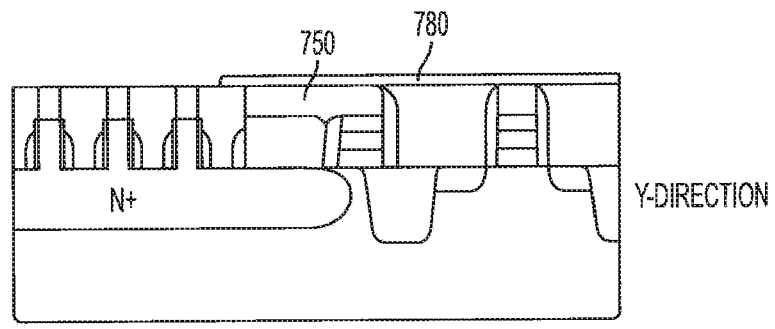
FIG. 7Kii

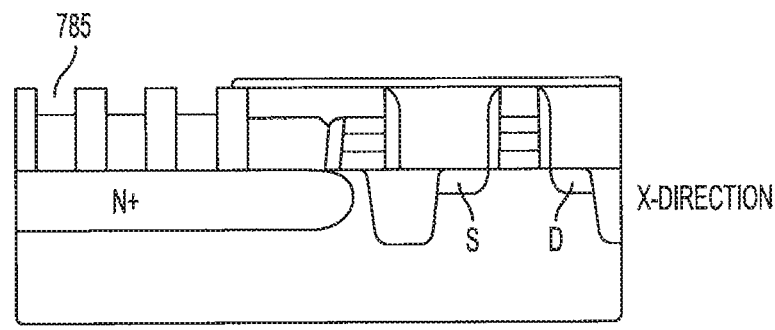
FIG. 7Li
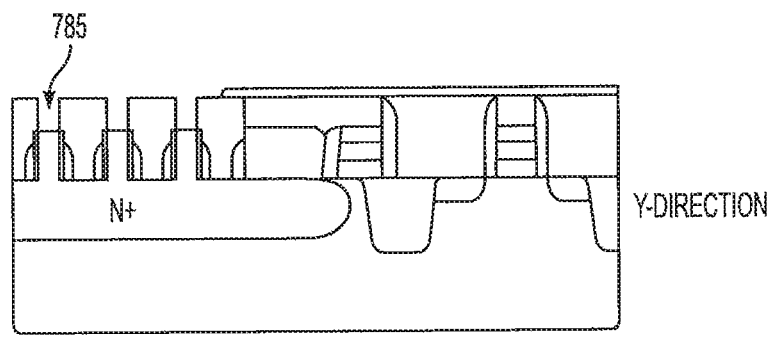
FIG. 7Lii

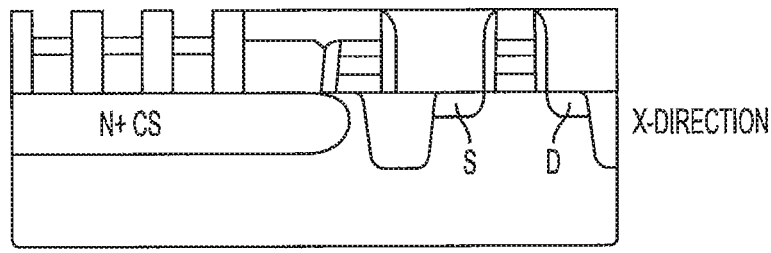
FIG. 7Mi
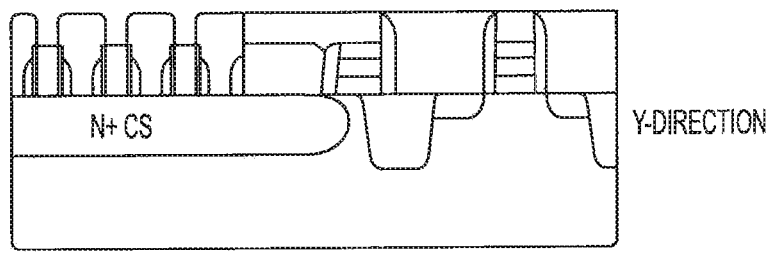
FIG. 7Mii

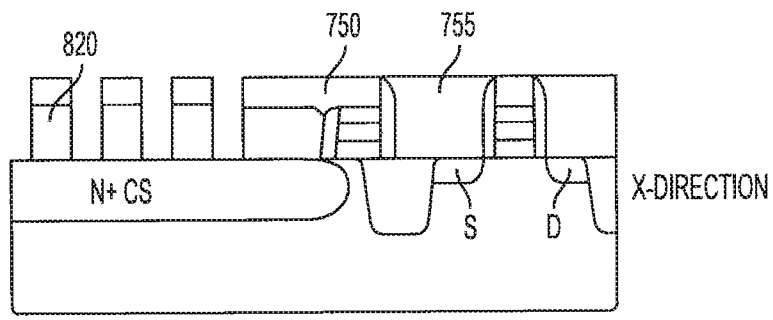
FIG. 8Ai
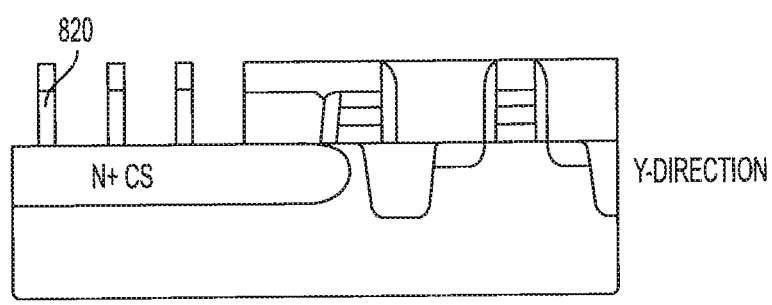
FIG. 8Aii

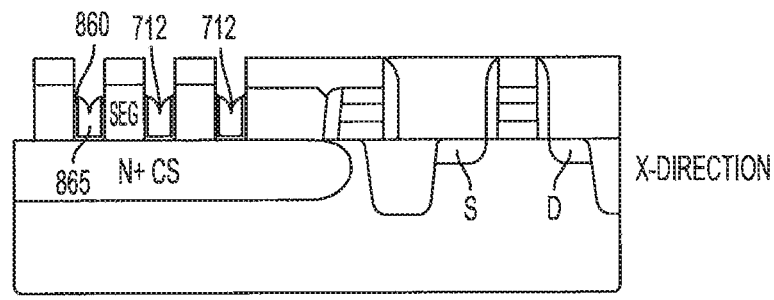
FIG. 8Bi
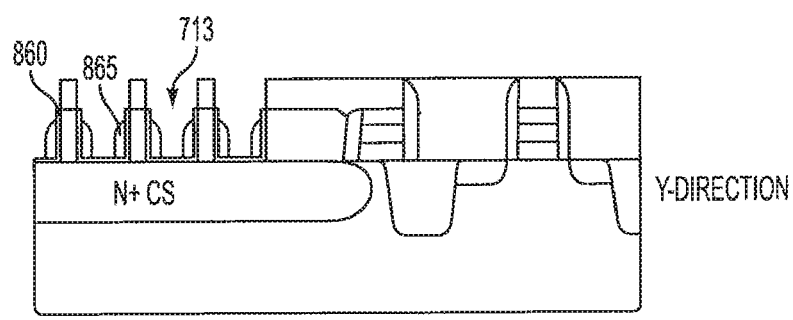
FIG. 8Bii

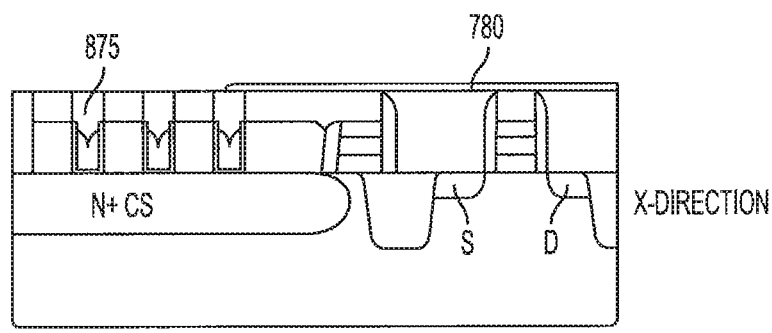
FIG. 8Ci
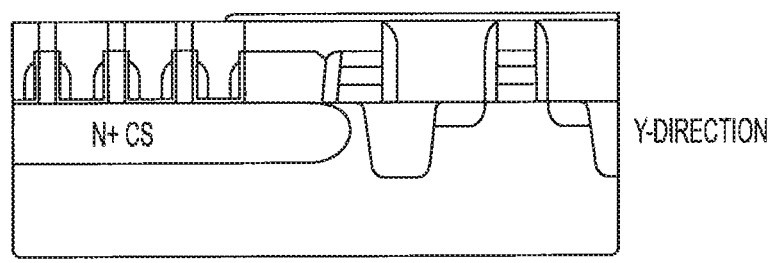
FIG. 8Cii

US 10,991,759 B2

METHODS OF FORMING VERTICAL FIELD-EFFECT TRANSISTOR WITH SELFALIGNED CONTACTS FOR MEMORY DEVICES WITH PLANAR PERIPHERY/ARRAY AND INTERMEDIATE STRUCTURES FORMED THEREBY

CROSS-REFERENCE TO RELATED APPLICATIONS

The present Application for Patent is a divisional application of U.S. patent application Ser. No. 13/078,274 by Liu et al. entitled "Methods of Forming Vertical Field-Effect Transistor with Self-Aligned Contacts for Memory Devices With Planar Periphery/Array and Intermediate Structures Formed Thereby," filed Apr. 1, 2011, assigned to the assignee hereof, and expressly incorporated by reference in its entirety herein.

TECHNICAL FIELD

Embodiments of the invention relate to methods of forming memory and semiconductor devices and, in particular, to methods of forming vertical field-effect transistors with self-aligned contacts for use in phase-change and other memory devices.

BACKGROUND OF THE INVENTION

Memory devices are widely used for data storage in electronic devices, such as digital cameras, cellular phones and other portable storage media. Memory can generally be characterized as either volatile or non-volatile. Volatile memory, for example, most types of random access memory (RAM), requires constant power to maintain stored information. A non-volatile memory device is capable of retaining stored information even when power to the memory device is turned off. One example of non-volatile memory is resistive memory cells, in which data is stored in memory cells by structurally or chemically changing a physical property of the memory cells in response to applied programming voltages, which in turn change cell resistance. A variable resistance material whose resistance changes according to its material phase is referred to as a phase-change material.

A particular example of a resistive memory cell using a phase-change material is a phase-change random access memory (PCRAM). In a PCRAM, the memory state is defined as either '0' or '1', due to a change in the phase of the phase-change material between a high resistance amorphous phase and a low resistance crystalline phase (or vice versa). One example of such phase-change materials is chalcogenide materials, which are alloys of Group VI elements of the periodic table, such as Te or Se. A specific chalcogenide currently used in rewriteable compact discs ("CD-RWs") is $Ge_2Sb_2Te_5$. In addition to having valuable optical properties that are utilized in CD-RW discs, $Ge_2Sb_2Te_5$ also has desirable physical properties as a variable resistance material. Various other combinations of Ge, Sb and Te may be used as variable resistance materials and are herein collectively referred to as "GST" materials.

A typical memory device includes a memory array along with its peripheral circuitry. A simplified diagram of a typical memory device 1400 is shown in FIG. 1. Memory device 1400 includes an array of memory bits 1315 arranged in rows and columns (such that each memory bit 1315 in the array may be uniquely identified). The memory bits 1315 are each connected to a row decoder 1460 by a plurality of respective word lines 1430 and to a column decoder 1450 by a plurality of respective cell select lines 1420. The row and column decoders 1460, 1450 and other electronics necessary for operating the memory device make up the peripheral circuitry of the memory device 1400. Each memory bit 1315 in the array includes a memory element (e.g., phase-change material) 220 and an access device 200.

Traditional memory access devices have been planar in nature, meaning that the access devices are formed layer by layer within the plane of the underlying structure (e.g., a substrate that is a base material and layers formed on the surface of the substrate). The access devices are formed within these layers so that the resulting devices are also laid out in a planar arrangement. As a specific example, a planar field-effect transistor ("FET") is a FET with a conductive channel that is within the layers of the underlying structure. Planar access devices have a relatively large footprint since area is required for source and drain regions and associated contacts as well as isolation between the contacts.

Recently, non-planar access devices have been used as alternatives to planar devices. Non-planar access devices are access devices that are not flat or planar and can be oriented in a vertical direction from a substrate. These devices can include raised portions that extend above the planar surface of the underlying structure. The thin vertical structure results in significant space savings over traditional planar access devices. Vertical transistors are also superior with respect to leakage and drive current as compared to planar transistors or p/n diodes with similar physical dimensions. Specifically, vertical transistors have reduced leakage and higher drive current as compared to other available transistor options.

FIG. 2 illustrates an example of a vertical FET (VFET) 100. The VFET 100 includes a thin vertical fin or mesa 120 through which current flows vertically between a source 130 and a drain 140. The mesa 120 extends above a substrate 115. A gate 150 is formed along a sidewall of the mesa 120. Gates 150 are separated from the sidewalls of the mesa 120 by thin gate insulators 155 such as a gate oxide. The thin gate insulators 155 are L-shaped in order to insulate the gates 150 from contact with the mesas 120 and the substrate or any conductor on the substrate. When an appropriate bias is applied to one or more of the gates 150, current flows vertically through the channel 125 from the source 130 to the drain 140.

As the size of electronic devices is becoming increasingly smaller, vertical transistors, such as that shown in FIG. 2, are becoming popular for use as a selection device for memory devices (such as phase-change memory devices) having smaller sizes (e.g., smaller than 22 nm). An example memory access device 200 is shown in FIG. 3A and a schematic diagram is shown in FIG. 3B. In FIG. 3A, memory cell 220 is electrically coupled to the VFET device 200. The memory cell 220 includes a top electrode 222 and a bottom electrode 224. The bottom electrode 224 is coupled to a contact 240 for the drain 140. The source 130 is coupled to a contact 230. Upon appropriate biasing of the source contact 230, the gate 150 and the top electrode 222, the VFET 200 is turned "on" and current flows through the channel 125 and memory cell 220. With appropriate biasing, the current flowing through the memory cell 220 is strong enough to be used as a programming or reset current for the memory cell 220.

However, in order to facilitate the production of the cell module and subsequent back-end-of-line (BEOL) production (e.g., when individual devices get interconnected with wiring on the wafer), it is preferred that these vertical transistors (which are formed above the substrate rather than within it) are integrated into the memory array in such a way that the array portion of the memory device has a top surface that is planar with the peripheral circuit transistor structures (hereinafter "periphery") of the memory device without any step height between the array and the periphery.

Accordingly, there exists a need for methods for forming vertical transistors with self-aligned contacts that results in the periphery and array portion of the memory cell being planar (or nearly planar) with each other.

BRIEF DESCRIPTION OF THE DRAWINGS

FIG. 4Ai is a cross-sectional view of a step in the fabrication of a memory device in accordance with a first disclosed embodiment.

FIG. 4Aii is a top-down view of FIG. 4Ai.

FIG. 4Bi is a cross-sectional view of a step in the fabrication of a memory device, following that shown in FIG. 4Ai.

FIG. 4Bii is a top-down view of FIG. 4Bi.

FIG. 4Ci is a cross-sectional view of a step in the fabrication of a memory device, following that shown in FIG. 4Bi.

FIG. 4Cii is a top-down view of FIG. 4Ci.

FIG. 4Dii is a top-down view of FIG. 4Di.

FIG. 4Eii is a top-down view of FIG. 4Ei.

FIG. 4Fii is a top-down view of FIG. 4Fi.

FIG. 4Gi is a cross-sectional view of a step in the fabrication of a memory device, following that shown in FIG. 4Fi.

FIG. 4Gii is a perpendicular cross-sectional view of the step shown in FIG. 4Gi, in the array portion of the memory device.

FIG. 4Giii is a top-down view of FIGS. 4Gi and 4Gii.

FIG. 4Hi is a cross-sectional view of a step in the fabrication of a memory device, following that shown in FIG. 4Gi.

FIG. 4Hii is a perpendicular cross-sectional view of the step shown in FIG. 4Hi, in the array portion of the memory device.

FIG. 4Hiii is a top-down view of FIGS. 4Hi and 4Hii.

FIG. 5Ai is a cross-sectional view of a step in the fabrication of a memory device in accordance with a second disclosed embodiment.

FIG. 5Aii is a top-down view of FIG. 5Ai.

FIG. 5Bi is a cross-sectional view of a step in the fabrication of a memory device, following that shown in FIG. 5Ai.

FIG. 5Bii is a top-down view of FIG. 5Bi.

FIG. 5Ci is a cross-sectional view of a step in the fabrication of a memory device, following that shown in FIG. 5Bi.

FIG. 5Cii is a top-down view of FIG. 5Ci.

FIG. 5Dii is a top-down view of FIG. 5Di.

FIG. 5Eii is a top-down view of FIG. 5Ei.

FIG. 5Fii is a top-down view of FIG. 5Fi.

FIG. 6A is a cross-sectional view of a step in the fabrication of a memory device in accordance with a third disclosed embodiment.

FIG. 6Bi is a cross-sectional view of a step in the fabrication of a memory device, following that shown in FIG. 6A.

FIG. 6Bii is a top-down view of FIG. 6Bi.

FIG. 6Ci is a cross-sectional view of a step in the fabrication of a memory device, following that shown in FIG. 6Bi.

FIG. 6Cii is a top-down view of FIG. 6Ci.

FIG. 6Dii is a top-down view of FIG. 6Di.

FIG. 6Eii is a top-down view of FIG. 6Ei.

FIG. 6Gii is a perpendicular cross-sectional view of the step shown in FIG. 6Gi, in the array portion of the memory device.

FIG. 6Giii is a top-down view of FIGS. 6Gi and 6Gii.

FIG. 7Gi is a cross-sectional view of a step in the fabrication of a memory device, following that shown in FIG. 7F.

FIG. 7Gii is a perpendicular cross-sectional view of the step shown in FIG. 7Gi.

FIG. 7Hi is a cross-sectional view of a step in the fabrication of a memory device, following that shown in FIG. 7Gi.

FIG. 7Hii is a perpendicular cross-sectional view of the step shown in FIG. 7Hi.

FIG. 7Ii is a cross-sectional view of step in the fabrication of a memory device, following that shown in FIG. 7Hi.

FIG. 7Iii is a perpendicular cross-sectional view of the step shown in FIG. 7Ii.

FIG. 7Ji is a cross-: sectional view of a step in the fabrication of a memory device, following that shown in FIG. 7Ii.

FIG. 7Jii is a perpendicular cross-sectional view of the step shown in FIG. 7Ji.

FIG. 7Ki is a cross-sectional view of a step in the fabrication of a memory device, following that shown in FIG. 7Ji.

FIG. 7Kii is a perpendicular cross-sectional view of the step shown in FIG. 7Ki.

FIG. 7Li is a cross-sectional view of a step in the fabrication of a memory device, following that shown in FIG. 7Ki.

FIG. 7Lii is a perpendicular cross-sectional view of the step shown in FIG. 7Li.

FIG. 7Mi is a cross-sectional view of a step in the fabrication of a memory device, following that shown in FIG. 7Li.

FIG. 7Mii is a perpendicular cross-sectional view of the step shown in FIG. 7Li.

FIG. 8Ai is a cross-sectional view of a step in the fabrication of a memory device, following that shown in FIG. 7F, in accordance with an alternative array processing method. of the fourth embodiment.

FIG. 8Aii is a perpendicular cross-sectional view of the step shown in FIG. 8Ai.

FIG. 8Bi is a cross-sectional view of a step in the fabrication of a memory device, following that shown in FIG. 8Ai.

FIG. 8Bii is a perpendicular cross-sectional view of the step shown in FIG. 8Bi.

FIG. 8Ci is a cross-sectional view of a step in the fabrication of a memory device, following that shown in FIG. 8Bi.

FIG. 8Cii is a perpendicular cross-sectional view of the step shown in FIG. 8Ci.

DETAILED DESCRIPTION OF THE DISCLOSED EMBODIMENTS

Figure 1:
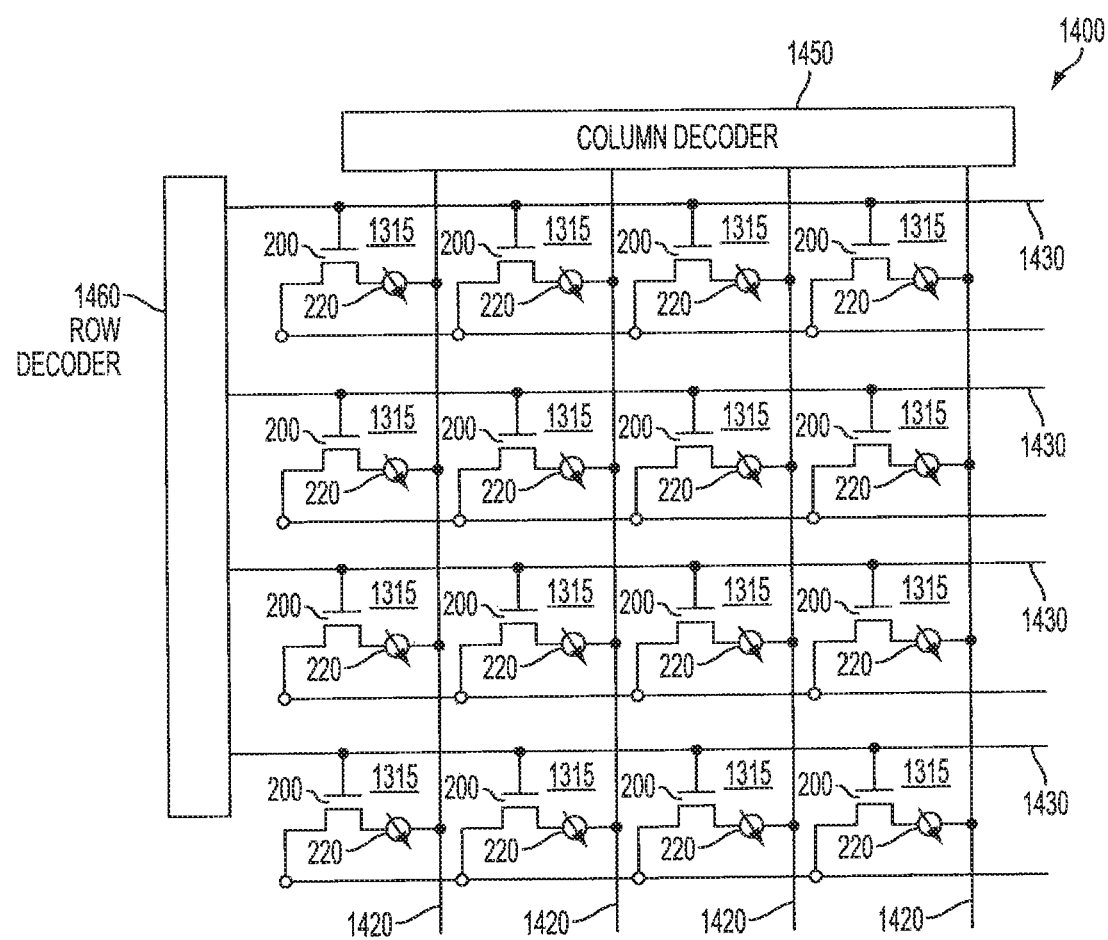
FIG. 1 is a simplified diagram of a typical memory device.
Figure 2:
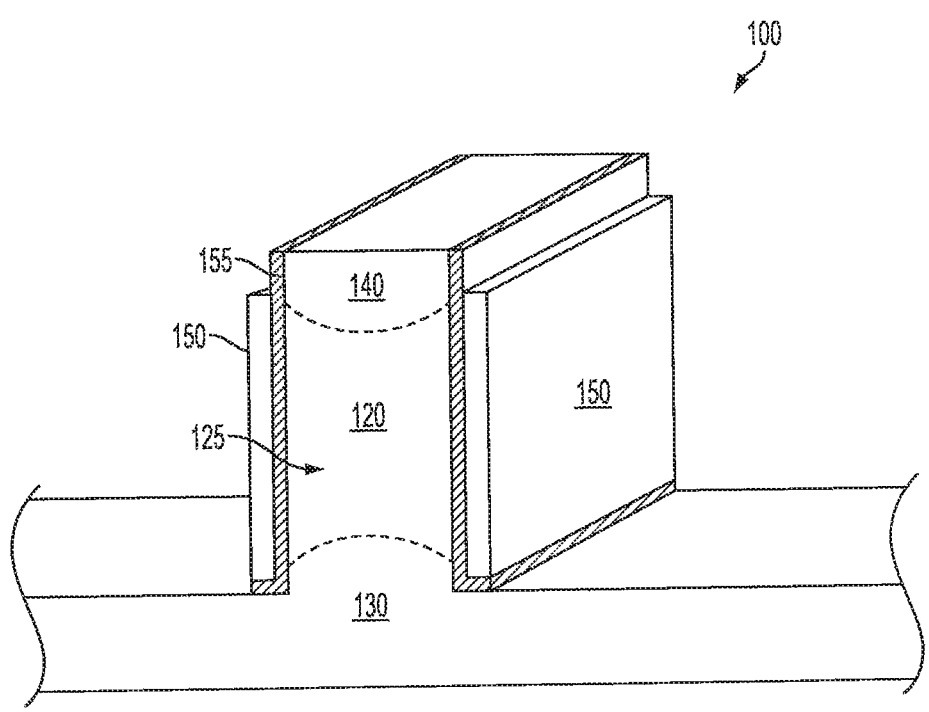
FIG. 2 illustrates a vertically oriented semiconductor transistor device.

In the following detailed description, reference is made to the accompanying drawings which form a part hereof, and in which are shown by way of illustration specific embodiments that may be practiced. It should be understood that like reference numbers represent like elements throughout the drawings. These example embodiments are described in sufficient detail to enable those skilled in the art to practice them. It is to be understood that other embodiments may be utilized, and that structural, material, and electrical changes may be made, without departing from the scope of the invention, only some of which are discussed in detail below.

The term "substrate" used in the following description may include any supporting structure including, but not limited to, a semiconductor substrate. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Embodiments of the invention relate to methods of forming memory devices having self-aligned contacts of the VFETs and that results in the periphery and array portions of the memory cell being nearly planar with each other after formation of these portions of the memory device. Several examples of processes are discussed herein; however one of skill in the art would recognize that changes may be made in the processes as long as the nearly planar surface of the resulting memory array and peripheral circuit transistor structures is maintained. In one embodiment, the average elevations of the surfaces of the periphery and array portions of the memory cell are within 500 Å of each other. More preferably, the average elevations of the surfaces of the periphery and array portions of the memory cell are within 200 Å of each other. The VFETs of the memory array may be arranged to have a common N+ source. In other words, the VFETs may be tied together on the bottom and have a common voltage (e.g., ground). The memory elements may be connected together by a series of bit lines arranged perpendicularly to the wordlines; giving unique memory addresses of a wordline and bitline in a cross-point array.

In a first embodiment, a planar periphery and array can be accomplished by first forming the periphery transistors, followed by formation of the array memory elements and access devices. Particulars of the method are now discussed with respect to FIGS. 4Ai to 4Hiii.

In FIGS. 4Ai and 4Aii, pad oxide 401 and nitride 402 are deposited on a substrate 400. FIG. 4Ai shows a cross-sectional view corresponding to both a periphery and array portion of the memory device. FIG. 4Aii shows a top-down view of the section of FIG. 4Ai corresponding to the array portion of the memory device. Subsequent figures are arranged in this same manner, unless otherwise noted. The pad oxide 401 may be formed, for example, of silicon dioxide. The nitride 402 may be, for example, silicon nitride. These materials may be formed by any known methods of deposition, such as chemical vapor deposition (CVD) or atomic layer deposition (ALD).

In FIGS. 4Bi and 4Bii, trenches 405 are formed in the periphery region for use as shallow trench isolation (STI) regions 406 (FIG. 4Ci). The trenches may be formed using any appropriate etching process known in the art for formation of STI regions.

Transistors 410 are then formed in the periphery region and the STI regions 416 are filled with, for example, silicon dioxide. The silicon surface of the array region is also provided with heavy n-type doping 403. Formation of the transistors in the periphery region in this embodiment is by any conventional method known in the art. The resulting structure is shown in FIGS. 4Ci and 4Cii.

Figure 4D:
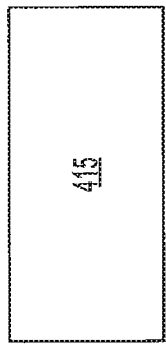
FIG. 4Di is a cross-sectional view of a step in the fabrication of a memory device, following that shown in FIG. 4Ci.
Figure 4D:
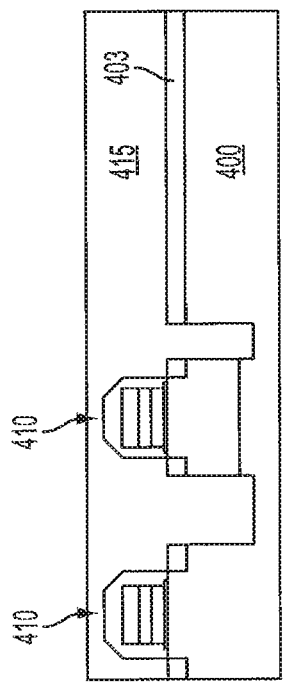

As shown in FIGS. 4Di and 4Dii, silicon dioxide 415 is deposited over both the periphery and array regions and planarized. The thickness of the silicon dioxide 415 is such that it extends above an upper surface of the periphery transistors 410.

Figure 4E:
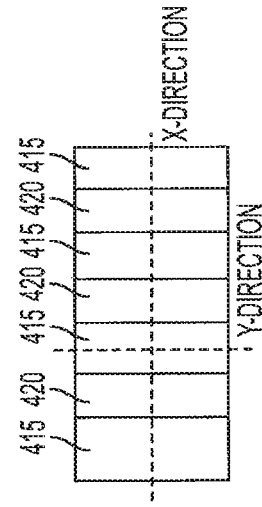
FIG. 4Ei is a cross-sectional view of a step in the fabrication of a memory device, following that shown in FIG. 4Di.
Figure 4E:
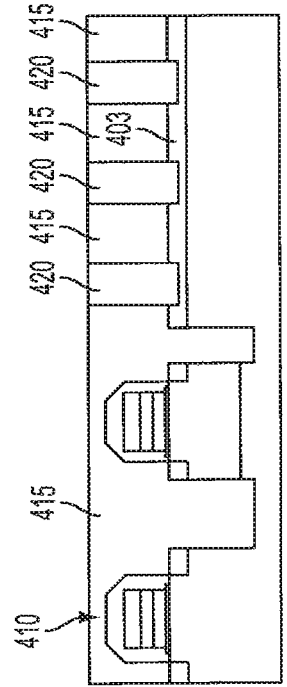

Trenches are then formed in the silicon dioxide 415 in the array portion of the memory device along the y-direction. These trenches are formed completely through the silicon dioxide 415 to the n+ doped silicon 403. Epitaxial silicon 420 is grown in each trench using, for example, a selective epitaxial growth method. The resulting structure is seen in FIGS. 4Ei and 4Eii. As previously mentioned, FIG. 4Eii is a top-down view of the array portion of FIG. 4Ei. In one example embodiment, the preferred "y-direction" is in the direction of the <100> direction on a (100) silicon wafer, as described in U.S. Pat. No. 7,498,265, incorporated by reference herein.

Figure 4F:
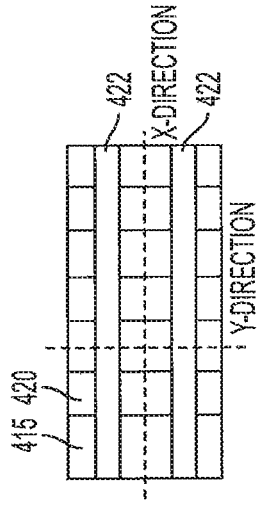
FIG. 4Fi is a cross-sectional view of a step in the fabrication of a memory device, following that shown in FIG. 4Ei.
Figure 4F:
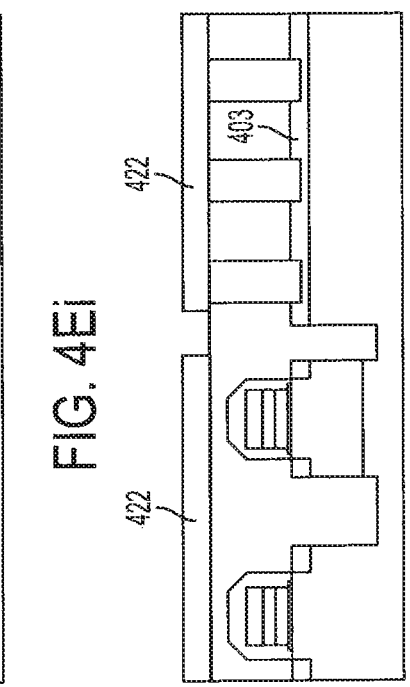

As shown in FIGS. 4Fi and 4Fii, photo patterning is used to form resist 422 along the x-direction in the array portion of the memory device. Then, a dry etch of the unmasked oxide 415 and silicon 420 down to the n+ doped silicon 403 in the array forms silicon 420 and oxide 415 pillars along the x-direction. This can be seen in FIGS. 4Gi, 4Gii and 4Giii, where FIG. 4Giii shows a top-view of cross-sectional FIGS. 4Gi and 4Gii, along the x-direction and y-direction, respectively. The periphery portion is protected by the resist 422 and a hard mask. After the dry etch, the resist pattern is removed.

Figure 3A:
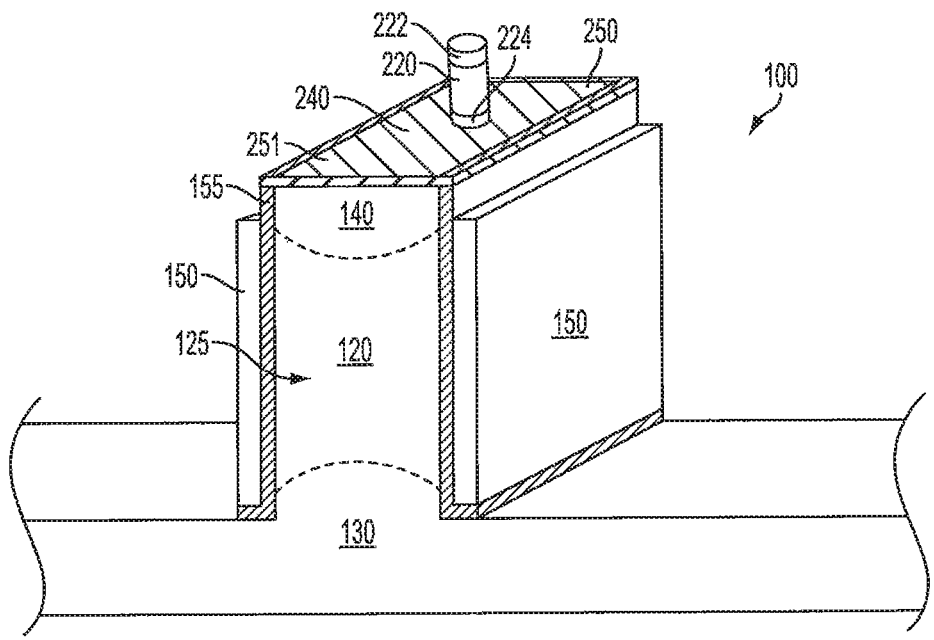
FIG. 3A illustrates an example memory cell and a memory access device (VFET).
Figure 3B:
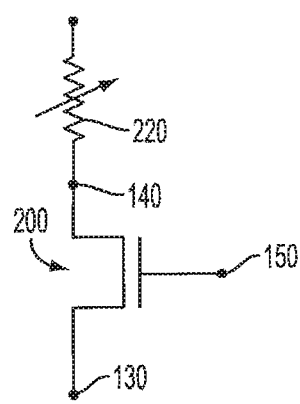
FIG. 3B is a schematic diagram of the example memory cell and a memory access device of FIG. 3A.

Next, as shown in FIGS. 4Hi, 4Hii and 4Hiii, a gate oxide 425 is formed on the exposed silicon pillar surfaces 420 and on exposed surfaces of the doped silicon 403. This is followed by deposition and etch of TiN, such that the TiN is recessed to below the top surface of the silicon/oxide pillars, thereby forming TiN side gate 430 (e.g., gate 150, FIG. 3A) on the gate oxide 425. Specifically, the TiN may be formed by ALD and spacer etch. The TiN may also be deposited by CVD, PECVD or PVD. As with FIGS. 4Gi, 4Gii and 4Giii, FIG. 4Hiii shows a top-view of cross-sectional FIGS. 4Hi and 4Hii, along the x-direction and y-direction, respectively. Following this step, the array is gap filled with an oxide deposit.

Figure 4I:
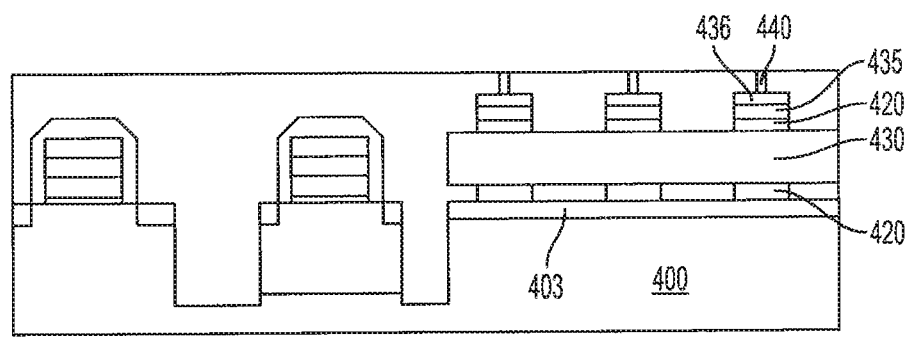
FIG. 4I is a cross-sectional view of a step in the fabrication of a memory device, following that shown in FIG. 4Hi.

Finally, as shown in FIG. 4I, the memory cell is formed. The silicon pillar 420 is recessed below the surface of the silicon dioxide 415. This provides an area for formation of the self-aligned contact of the VFET. A top surface of the silicon pillar 420 is n+ doped 435 to form a drain region for the VFET (e.g., drain 140, FIG. 3A). This is followed by silicidation to form a silicide (e.g., $CoSi_2$ or $TiSi_2$) contact 436 (e.g., contact 240, FIG. 3A). A phase-change material 440, such as GST, is deposited (by known methods, such as CVD or ALD) in the contact recess to form a confined cell. Alternatively, an additional dielectric material may be deposited followed by contact etch and CVD or ALD phase-:change confined cell formation. Additionally, metal can be deposited in the contact with subsequent recess formation and phase change material deposition to form a confined cell with bottom electrode (e.g., electrode 224, FIG. 3A).

At this stage, conventional back-end-of-line processes may proceed without any problems of step-change between the array and the peripheral circuit transistor structures.

In a second embodiment, a planar periphery and array can be accomplished by first forming the periphery transistors, followed by formation of the array memory elements and access devices, similar to in the first embodiment. The second embodiment further includes an all-around gate on the access transistors. Particulars of the method are now discussed with respect to FIGS. 5Ai to 5Fii.

Similar to the method described with respect to FIGS. 4Ai to 4Hiii, the method of the second embodiment begins with deposition of pad oxide 501 and nitride 502 on a substrate 500 followed by formation of trenches 505 in the periphery region for use as shallow trench isolation (STI) regions 406 (FIG. 5Bi), as shown in FIGS. 5Ai and 5Aii. FIG. 5Ai shows a cross-sectional view corresponding to both a periphery and array portion of the completed memory device and FIG. 5Aii shows a top-down view of the section of FIG. 5Ai corresponding to the array portion of the completed memory device.

As shown in FIGS. 5Bi and 5Bii (and as described in more detail above with respect to FIGS. 4Ci and 4Cii), transistors 510 are formed in the periphery region, the STI regions 506 are filled with, for example, silicon dioxide, and the upper surface of the substrate is n+ doped to form n+ doped region 503. As shown in FIGS. 5Ci and 5Cii (and as described in more detail above with respect to FIGS. 4Di and 4Dii), silicon dioxide 515 is deposited over both the periphery and array regions and planarized. As discussed with respect to the previous embodiment, the depth of the silicon dioxide 515 is such that it extends above a surface of the transistors 510. FIGS. 5Bi and 5Ci show a cross-sectional view corresponding to both a periphery and array portion of the completed memory device and FIGS. 5Bii and 5Cii show a top-down view of the section of FIGS. 5Bi and 5Ci, respectively, corresponding to the array portion of the completed memory device.

Figure 5D:
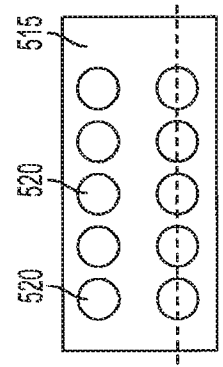
FIG. 5Di is a cross-sectional view of a step in the fabrication of a memory device, following that shown in FIG. 5Ci.
Figure 5D:
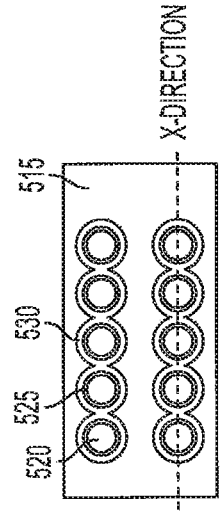
Figure 5D:
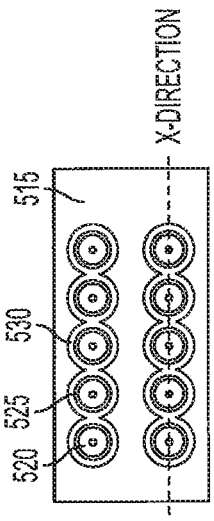
Figure 5D:
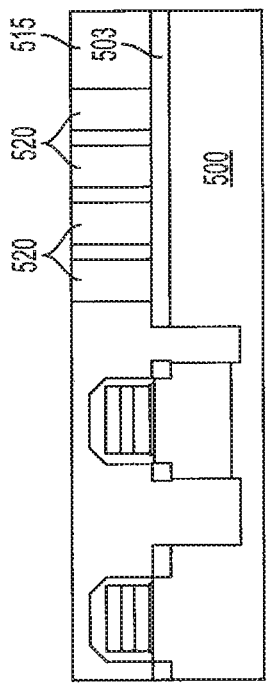

As shown in FIGS. 5Di and 5Dii, contact etch can be used to etch columns completely through the silicon dioxide 515 down to the n+ doped silicon 503. This is followed by epitaxial silicon growth, for example using a selective epitaxial growth method, to form silicon pillars 520.

Figure 5E:
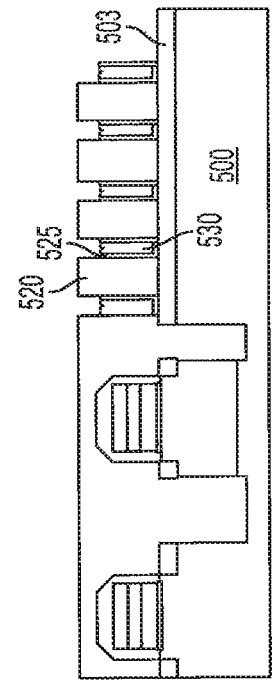
FIG. 5Ei is a cross-sectional view of a step in the fabrication of a memory device, following that shown in FIG. 5Di.

As shown in FIGS. 5Ei and 5Eii, an oxide etch, for example a wet etch, can be used to selectively remove the silicon dioxide 515. A mask (not shown) in used to protect the periphery circuit transistor structures during this process. Gate oxide 525 is formed on the exposed surfaces of the silicon pillars 520. This is followed by deposition and etching of TiN, such that the TiN is recessed below the surface of the silicon pillars 520. As can be seen in FIG. 5Eii, because the spacing of the pillars 520 is narrower in the x-direction than it is in the y-direction (and as long as the TiN thickness is not greater than half the distance of the spacing in the y-direction) the TiN gate is merged in the x-section, forming a continuous surrounding TiN side gate 530 on the gate oxide 525, that is self-aligned and isolated from the adjacent gate in the y-direction. As described above, the TiN may be formed by ALD and spacer etch. The TiN may also be deposited by CVD, PECVD or PVD.

Figure 5F:
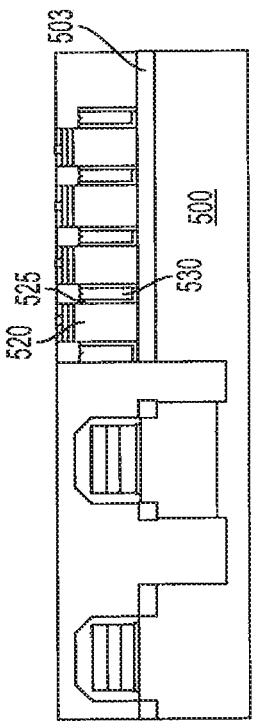
FIG. 5Fi is a cross-sectional view of a step in the fabrication of a memory device, following that shown in FIG. 5Ei.

As shown in FIGS. 5Fi and 5Fii, silicon dioxide is deposited and planarized to even the surface of the array. Then, as described in more detail above with respect to FIG. 4I, the silicon pillars 520 are recessed (to provide an area for formation of the self-aligned contact of the VFET) and formation of the memory element is completed above the silicon pillars 520. Conventional back-end-of-lne processes may then proceed.

Each of the first and second embodiments described above provides for a planar periphery and array, thereby simplifying subsequent production processes. They also each allow for self-aligned formation of the contacts for a phase-change memory cell. Traditional manufacturing methods did not provide these advantages. In addition to the benefits described above with respect to the first and second embodiments, a third embodiment provides an additional benefit of shared patterning steps for formation of the array and periphery, thus simplifying the manufacturing process further. Particulars of this embodiment are now described with respect to FIGS. 6A-6H.

Similar to the first and second embodiments described above, the third embodiment begins with deposition of pad oxide 601 and nitride 602 on a substrate 600. Appropriate p-doping 609 of the periphery transistor area and n+ doping 613 of the array area are completed at this stage as well. Then, trenches are formed concurrently in both the periphery region (for use as shallow trench isolation (STI) regions 606) 605 and in the array 607. Formation of the array trenches 607 produces silicon fins 620. The resulting structure at this point in the process is shown in FIG. 6A.

As shown in FIGS. 6Bi and 6Bii, the STI regions and array trenches are filled with silicon dioxide 615 that is planarized to the level of the silicon nitride 602. The y-direction orientation of the trenches (of FIG. 6A) can be seen more clearly in FIG. 6Bii, which is a top-down view of FIG. 6Bi in the array portion of the memory device.

Figure 6D:
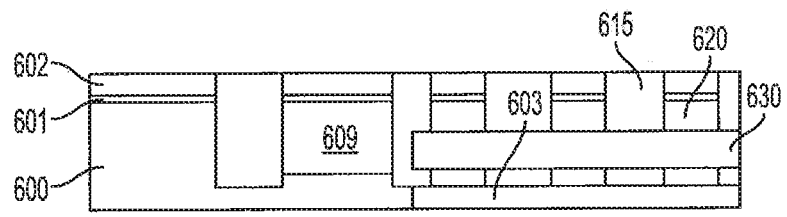
FIG. 6Di is a cross-sectional view of a step in the fabrication of a memory device, following that shown in FIG. 6Ci.

As shown in FIGS. 6Ci and 6Cii, photo patterning is used to form resist 622 along the x-direction in the array portion of the memory device. Then, a dry etch of the unmasked oxide 615, nitride 602 and silicon 620 down to the n+ doped silicon 603 forms silicon 620 and oxide 615 pillars along the x-direction. This can be seen in FIGS. 6Di and 6Dii. The periphery portion is protected by the resist 622 and a hard mask After the dry etch, the resist pattern is removed. FIGS. 6Ci and 6Di show a cross-sectional view corresponding to both a periphery and array portion of the completed memory device and FIGS. 6Cii and 6Dii show a top-down view of the section of FIGS. 6Ci and 6Di, respectively, corresponding to the array portion of the completed memory device.

A gate oxide 625 (see FIG. 6Gii) is formed on the exposed surfaces of the silicon pillars 620 and on exposed surfaces of the doped silicon 603. This is followed by deposition and etching of TiN, such that the TiN is recessed to below the top surface of the silicon pillars 620, thereby. forming TiN gate 630 on the gate oxide 625. The particulars of these process steps are discussed in more detail with respect to FIGS. 4Gi, 4Gii, 4Giii, 4Hi, 4Hii and 4Hiii, above.

Figure 6E:
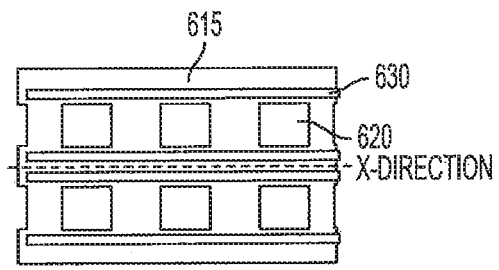
FIG. 6Ei is a cross-sectional view of a step in the fabrication of a memory device, following that shown in FIG. 6Di.
Figure 6E:
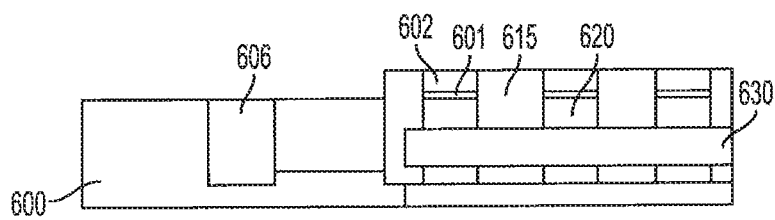
Figure 6F:
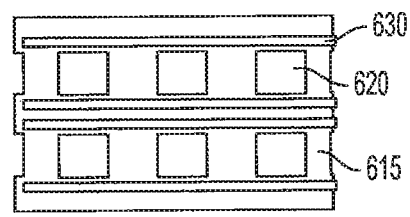
FIG. 6F is a cross-sectional view of a step in the fabrication of a memory device, following that shown in FIG. 6Ei.
Figure 6F:
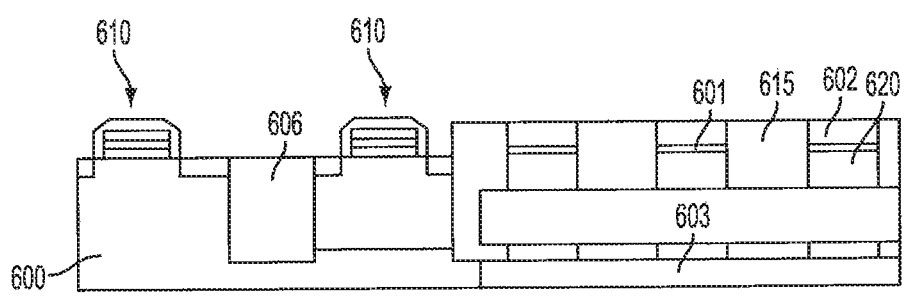

As shown in FIGS. 6Ei and 6Eii, an etch, for example a wet etch, is used to remove the nitride 602 and oxide 601 in the periphery to prepare for formation of the periphery transistors 610. Next, as shown in FIG. 6F, the periphery transistors 610 are formed (by any appropriate method), having tops at the same height as the nitride 602 and oxide 615 in the array. Additional silicon dioxide 615 is deposited and planarized to even the surface of the periphery to the array.

Figure 6G:
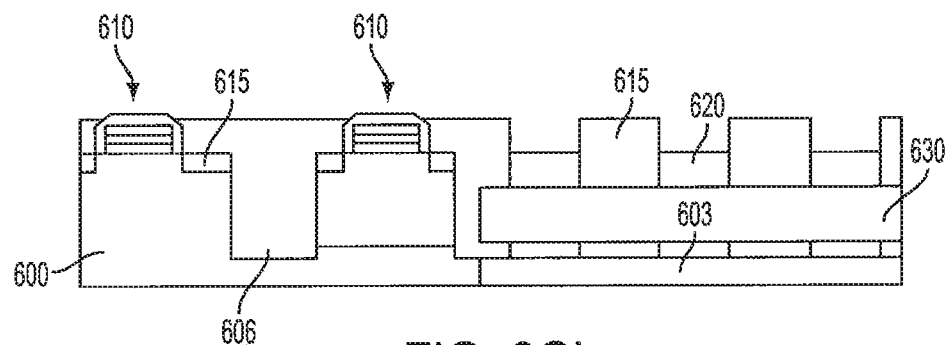
FIG. 6Gi is a cross-sectional view of a step in the fabrication of a memory device, following that shown in FIG. 6Fi.
Figure 6H:
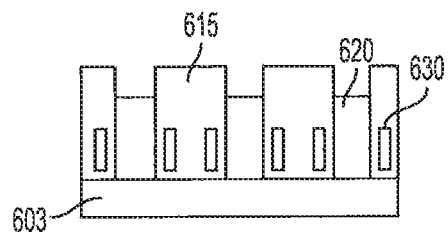
FIG. 6H is a cross-sectional view of a step in the fabrication of a memory device, following that shown in FIG. 6Gi.
Figure 6H:
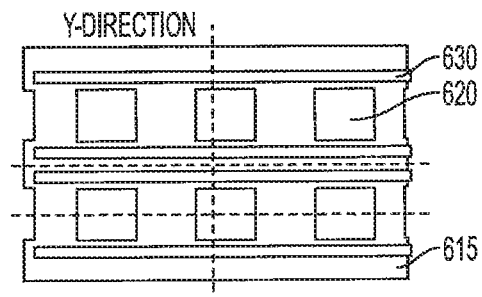
Figure 6H:
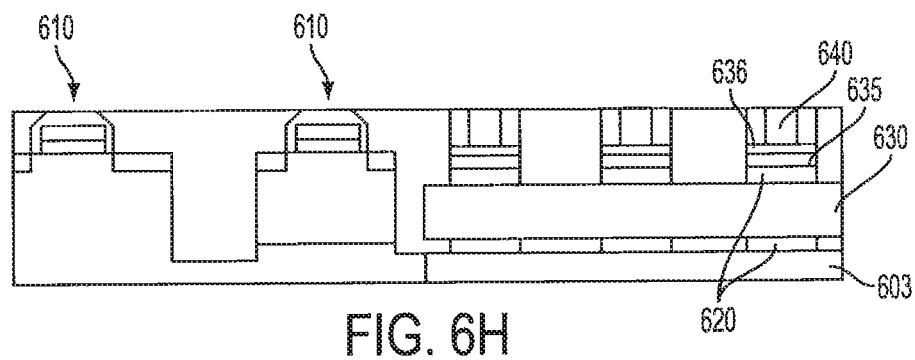

As shown in FIGS. 6Gi, 6Gii and 6Giii, the remaining silicon nitride 602 and pad oxide 601 in the array portion of the memory device are removed via an etch process. This provides a self-aligned contact to the VFET. As shown in FIG. 6H, n+ doping 635 is applied to the upper portions of the silicon pillar 620, followed by silicidation to form contact 636, and deposition of a phase-change material 640. Further details of the formation of the memory cell are discussed above with respect to FIG. 4I. Conventional back-end-of-line processes may then proceed.

Figure 7A:
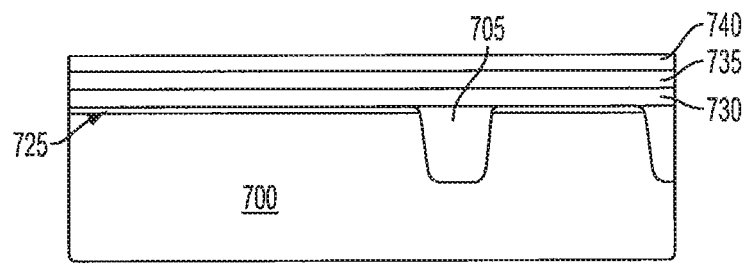
FIG. 7A is a cross-sectional view of a step in the fabrication of a memory device in accordance with a fourth disclosed embodiment.

Particulars of a fourth embodiment are now described with respect to FIGS. 7A to 8Cii. As seen in FIG. 7A, shallow trench isolation regions 705 for the peripheral circuitry are formed in trenches formed within a substrate 700 and filled with a dielectric material, such as silicon dioxide, as is known in the art. Then, gate stack materials are formed on the substrate. Specifically, a gate oxide 725, polysilicon 730, a metal 735 and a nitride 740 are formed on a surface of the substrate 700. In one example, the polysilicon 730 may be approximately 450 Å thick, the metal 735 may be either tungsten silicide (WSIX) at a thickness of approximately 800 Å or tungsten nitride/tungsten (WN/W) at a thickness of approximately 500 Å, and the nitride 740 may be approximately 300-500 Å thick. Any other gate stack having a nitride cap is appropriate.

Figure 7B:
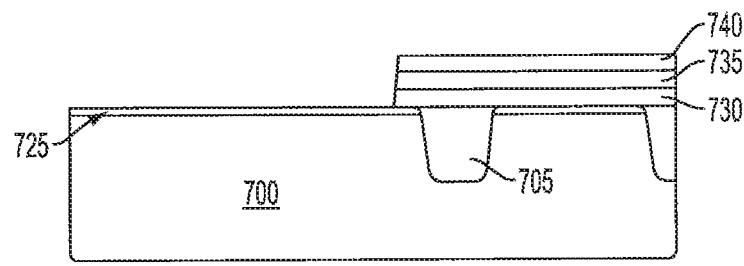
FIG. 7B is a cross-sectional view of a step in the fabrication of a memory device, following that shown in FIG. 7A.
Figure 7C:
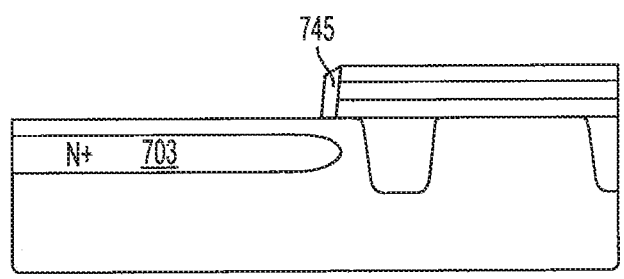
FIG. 7C is a cross-sectional view of a step in the fabrication of a memory device, following that shown in FIG. 7B.

As seen in FIG. 7B, photolithography and etching (stopping on the gate oxide) is used to remove the gate stack materials 730, 735, 740 from the array area of the memory device. A nitride spacer 745 is formed on the edge of the gate stack closest the array. This is shown in FIG. 7C. The nitride spacer 745 may be formed using a dry etch process to have a width of approximately 500-700 Å. Also, the upper portion of the array surface is n+ doped 703. An optional rapid thermal processing (RTP) anneal and H+ anneal at approximately 900° C. may occur following the doping of the array surface.

Figure 7D:
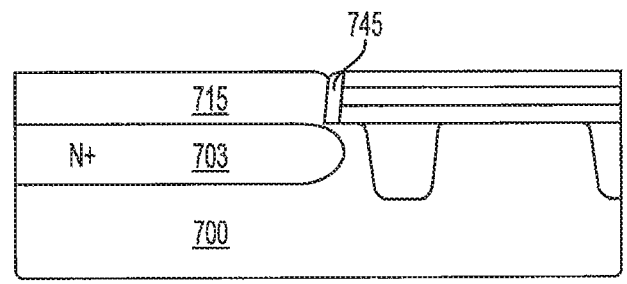
FIG. 7D is a cross-sectional view of a step in the fabrication of a memory device, following that shown in FIG. 7C.
Figure 7E:
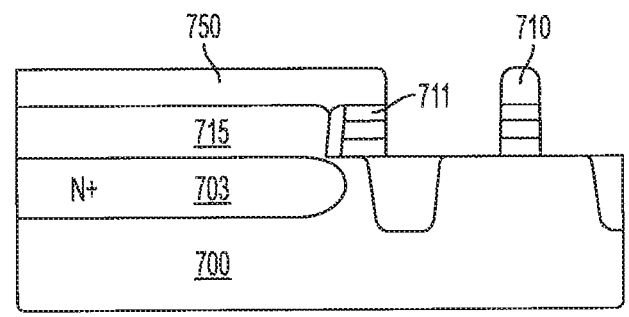
FIG. 7E is a cross-sectional view of a step in the fabrication of a memory device, following that shown in FIG. 7D.
Figure 7F:
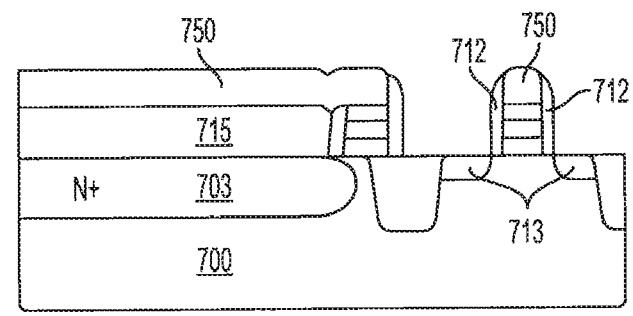
FIG. 7F is a cross-sectional view of a step in the fabrication of a memory device, following that shown in FIG. 7E.

As shown in FIG. 7D, epitaxial silicon 715 is grown on the surface of the array, for example by a selective epitaxial growth method, up to the level of the gate stack thickness. Next, a nitride cap 750 is deposited over the entire device. This nitride cap 750 may have a thickness of approximately 800 to 1200 Å. Optionally a pad oxide (not shown) may be deposited before the nitride deposition. Following deposition of the nitride cap, the peripheral portion of device is patterned and etched, forming the transistor gates 710 for the peripheral circuit transistor structures and a dummy hedge 711 between the periphery and the array. The dummy hedge 711 acts as a transition area between the periphery and the array. This resulting structure is shown in FIG. 7E. As seen in FIG. 7F, the peripheral transistor spacers 712 and implants 713 (to form source and drain regions) are formed according to known methods. Transistor processing is completed according to known methods.

Once the peripheral transistors are formed, the array processing may begin. Two examples of the array processing according to the fourth embodiment are described herein. The first is described with respect to FIGS. 7Gi to 7Kii. The second is described with respect to FIGS. 8Ai to 8Cii.

In one method of array processing, trenches 712 are formed (in a line/space pattern) through the nitride cap 750 and epitaxial silicon 715 to the upper surface of the n+ doped 703 substrate. This may be done, for example, using in situ reactive ion etching (RIB). Trench depth may be controlled in a manner similar to those known for controlling the depth of STI regions. This resulting structure is shown in FIGS. 7Gi and 7Gii. As shown in FIGS. 7Hi and 7Hii, the trenches are filled with an oxide 755. For example, CVD deposition of tetraethoxysilane (TEOS). The oxide 755 is deposited to overflow the trenches and to form an oxide 755 over the peripheral circuit transistor structures.

As seen in FIGS. 7Ii and 7Ii, additional trenches 713 are formed, in a line/space pattern perpendicular to that formed in the step illustrated in FIG. 7Gi, to about the same depth as this first pattern (e.g., to the n+ doped surface 703 of the substrate). These trenches 713 may also be formed by in situ RIB. A gate oxide 760 is formed on exposed silicon surfaces within the trench 713. Metal gate material is deposited on the gate oxide 760 and etched to about 500 Å below a surface of the trench 713 to produce side gates 765. The side gate may be formed, for example, of TiN using ALD and spacer etch. During these processes, the periphery is protected by the oxide and nitride.

In FIGS. 7Ji and 7Jii, the array is gap filled with an oxide 770. Optionally, the lightly doped source region of the VFET may be implanted prior to the deposition of the oxide 770.

Once the oxide deposition is complete, a stop-on-nitride CMP process occurs, to remove any excess oxide and remaining portions of the oxide 755.

In FIGS. 7Ki and 7Kii, a protective oxide cap 780 is formed over the periphery portion of the memory device. This oxide cap 780 may have a thickness of about 100-300 Å. The oxide cap 780 acts to protect the periphery during removal of the nitride cap 750 from the array portion the device, as seen in FIG. 7Li and FIG. 7Lii. The removal of the nitride cap 750 creates a recess 785 for formation of the self-aligned memory contact of the VFET. The protective oxide cap 780 is then removed.

In FIGS. 7Mi and 7Mii the recess may be, optionally, cleaned, for example by a wet clean, to shape the contact. The upper surface of the epitaxial silicon in the recess is doped, forming the drain region of the VFET. If the doping of the source region of the VFET was not completed earlier in the process, this is done at this stage as well. Then, as described above with respect to FIG. 4l, this is followed by silicidation (or metal deposition) to form the contacts and deposition of a phase-change material for the memory cell. Conventional back-end-of-line processes may then proceed.

Proceeding from the structure shown in FIGS. 7Gi and 7Gii, the second option of array processing in the fourth embodiment will now be described. As described above with respect to FIGS. 7Gi and 7Gii a line/space pattern of trenches 712 is formed in the y-direction and these trenches 712 are filled with oxide material 755. Then a line/space pattern of trenches 713 is formed perpendicular (in the x-direction). A pre-gate oxide clean is performed, which removes the oxide 755 not only from above the nitride cap 750 but also from between the epitaxial pillars 820. This results in the structure shown in FIGS. 8Ai and 8Aii.

A gate oxide 860 is formed on exposed silicon surfaces of the pillars 820: A metal gate material is deposited on the gate oxide 860 and etched to form gates 865. The metal gate material is etched to about 500 Å below a surface of the silicon pillars 820 to produce the side gates 865. The gate may be formed, for example, of TiN using ALD and spacer etch. Additionally, as can be seen in the figures, the metal gate thickness may contact neighboring material in the x-direction (FIG. 8Bi), but not in the y-direction (FIG. 8Bii). As described previously, during these processes, the periphery is protected by the oxide and nitride, which are removed after the gate formation and are not seen in FIGS. 8Bi and 8Bii. In FIGS. 8Ci and 8Cii, the array is gap filled with an oxide 875, and planarized to remove any excess oxide and remaining portions of the oxide 755, as described in more detail above with respect to FIGS. 7Ji and 7Jii. A protective oxide cap 780 is formed over the periphery portion of the memory device, as described above with respect FIGS. 7Ki and 7Kii. The remainder of the process follows that as described with respect to FIGS. 7Li to 7Mii. Further details of the formation of the memory cell are discussed above with respect to FIG. 4l Conventional back-end-of-line processes may then proceed.

Figure 9:
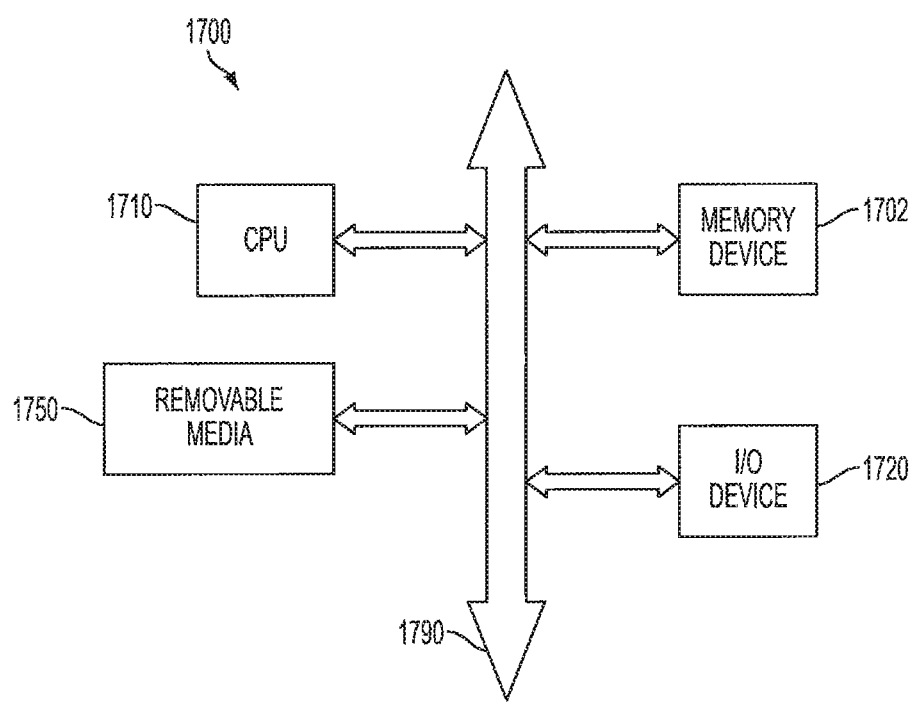
FIG. 9 illustrates a processing system including a memory device, formed in accordance with one or more of the disclosed embodiments.

It should be appreciated that the memory devices described herein may be fabricated as part of an integrated circuit. The corresponding integrated circuits may be utilized in a processor system. For example, FIG. 9 illustrates a simplified processor system 1700, which includes a memory device 1702 that includes a memory device constructed in accordance with any of the above described embodiments. A processor system, such as a computer system, generally comprises a central processing unit (CPU) 1710, such as a microprocessor, a digital signal processor, or other programmable digital logic devices, which communicates with an input/output (I/O) device 1720 over a bus 1790. The memory device 1702 communicates with the CPU 1710 over bus 1790 typically through a memory controller.

In the case of a computer system, the processor system 1700 may include peripheral devices such as removable media devices 1750 (e.g., CD-ROM drive or DVD drive) which communicate with CPU 1710 over the bus 1790. Memory device 1702 can be constructed as an integrated circuit, which includes one or more phase change memory devices. If desired, the memory device 1702 may be combined with the processor, for example CPU 1710, as a single integrated circuit.

It should also be appreciated that various embodiments have been described as using a phase-change material as an example resistance variable material. The invention may also be used in other types of resistive memory to improve and simplify manufacturing regardless of the resistance variable material used. The invention may also be used for other types of memories, such as RRAM, FGRAM, MRAM, STTRAM, etc.

The above description and drawings should only be considered illustrative of example embodiments that achieve the features and advantages described herein. Modification and substitutions to specific process conditions and structures can be made. Accordingly, the invention is not to be considered limited by the foregoing description and drawings, but is only limited by the scope of the appended claims

What is claimed is:

1. A memory device, comprising:
a substrate including a first region and a second region;
a plurality of peripheral circuit transistors formed on the substrate in the first region;
a plurality of array transistors formed on the substrate in the second region, each of the plurality of array transistors having a pillar and a self-aligned contact that extends to a first width within a volume that is self-aligned with the pillar;
a plurality of confined phase change memory cells, each of the plurality of confined phase change memory cells comprising a phase change material that extends to a second width less than the first width confined within the volume that is self-aligned with the pillar and in direct contact with the self-aligned contact of a respective one of the plurality of array transistors, the volume comprising the first width, a length, and a height that extends from a bottom surface of the plurality of array transistors to an upper surface of the phase change material; and
a dielectric portion over at least the first region, the dielectric portion including an upper surface that is coplanar with the upper surface of the phase change material.

2. The memory device of claim 1, wherein the first region comprises a periphery region, and wherein the second region comprises an array region.

3. The memory device of claim 1, wherein the plurality of confined phase change memory cells are formed in direct contact with a silicide of the self-aligned contact of the respective one of the plurality of array transistors.

4. The memory device of claim 1, wherein at least one of the plurality of peripheral circuit transistors is formed on the substrate between shallow trench isolation regions of the substrate in the first region.

5. The memory device of claim 1, further comprising:
a common doped portion forming a source portion of at least a subset of the plurality of array transistors.

6. The memory device of claim 1, wherein the plurality of array transistors are associated with gates that are below a top surface of the respective pillar.

7. A memory device, comprising:
a plurality of peripheral circuit transistors formed on a substrate in a first region;
a plurality of array transistors formed on the substrate in a second region, each of the plurality of array transistors having a self-aligned contact, wherein at least one of the plurality of array transistors is a vertical transistor comprising a pillar and a gate portion, and wherein the self-aligned contact of the at least one of the plurality of array transistors extends to a first width within a volume that is self-aligned with the pillar;
a plurality of confined phase change memory cells, each of the plurality of confined phase change memory cells comprising a phase change material that extends to a second width less than the first width confined within the volume that is self-aligned with the pillar of the respective one of the plurality of array transistors and in direct contact with the self-aligned contact of a respective one of the plurality of array transistors, the volume comprising the first width, a length, and a height that extends from a bottom surface of the plurality of array transistors to an upper surface of the phase change material; and
a dielectric portion over at least the first region, the dielectric portion including an upper surface that is coplanar with the upper surface of the phase change material.

8. The memory device of claim 7, wherein the self-aligned contact of the at least one of the plurality of array transistors is formed in a recess of the pillar of the respective array transistor.

9. The memory device of claim 7, wherein the pillar of the at least one of the plurality of array transistors has a cross section, parallel to the substrate, that is rectangular.

10. The memory device of claim 7, wherein the pillar of the at least one of the plurality of array transistors comprises a silicon portion formed on the substrate in the second region.

11. The memory device of claim 10, wherein the silicon portion is formed on a doped portion of the substrate in the second region.

12. The memory device of claim 7, wherein a material of the gate portion of a first of the plurality of array transistors is contiguous with a material of the gate portion of a second of the plurality of array transistors.

13. The memory device of claim 7, wherein the plurality of confined phase change memory cells are formed in direct contact with a silicide of the self-aligned contact of the respective one of the plurality of array transistors.

14. The memory device of claim 7, wherein, for the at least one of the plurality of array transistors, a material of the gate portion is below a surface of the pillars that is opposite from the substrate.

15. A memory device, comprising:
a peripheral circuit transistor formed on a substrate in a first region;
an array transistor formed on the substrate in a second region, the array transistor having a self-aligned contact that extends to a first width within a volume that is self-aligned with a pillar of the array transistor;
a confined phase change memory cell comprising a phase change material that extends to a second width less than the first width confined within the volume and in direct contact with the self-aligned contact of the array transistor, the volume comprising the first width, a length, and a height that extends from a bottom surface of the array transistor to an upper surface of the phase change material; and
a dielectric portion over at least the first region, the dielectric portion including an upper surface that is coplanar with the upper surface of the phase change material.

16. The memory device of claim 15, wherein the confined phase change memory cell is formed in direct contact with a silicide of the self-aligned contact of the array transistor.

17. The memory device of claim 15, wherein the array transistor is formed on a doped portion of the substrate in the second region.

* * * * *